United States Patent
Kim (10) Patent No.: US 8,008,150 B2
(45) Date of Patent: Aug. 30, 2011

(54) METHODS OF FABRICATING FLASH MEMORY DEVICES INCLUDING SUBSTANTIALLY UNIFORM TUNNEL OXIDE LAYERS

(75) Inventor: Jae-Hoon Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/789,560

(22) Filed: May 28, 2010

(65) Prior Publication Data

US 2010/0240193 A1 Sep. 23, 2010

Related U.S. Application Data

(62) Division of application No. 11/555,796, filed on Nov. 2, 2006, now abandoned.

(30) Foreign Application Priority Data

Nov. 3, 2005 (KR) .................. 10-2005-0105098

(51) Int. Cl.
*H01L 21/336* (2006.01)

(52) U.S. Cl. ........ 438/258; 438/201; 438/593; 438/981; 257/E21.209

(58) Field of Classification Search .................. 438/201, 438/258, 593, 981; 257/E21.209
See application file for complete search history.

(56) References Cited

U.S. PATENT DOCUMENTS

| 2003/0119260 A1 | 6/2003 | Kim et al. |
| 2004/0029389 A1 | 2/2004 | Lo |
| 2005/0106813 A1 | 5/2005 | Lee et al. |
| 2006/0246657 A1 | 11/2006 | Kim et al. |
| 2006/0270181 A1* | 11/2006 | Sandhu et al. ............. 438/424 |

FOREIGN PATENT DOCUMENTS

| JP | 2005-150676 | 6/2005 |
| KR | 1020040082184 A | 9/2004 |
| KR | 1020050002411 A | 1/2005 |
| KR | 1020050048114 A | 5/2005 |

* cited by examiner

*Primary Examiner* — Jack Chen
(74) *Attorney, Agent, or Firm* — Myers Bigel Sibley & Sajovec, P.A.

(57) ABSTRACT

A method of forming a flash memory device in a memory cell region of a substrate includes forming a first insulating layer on the substrate, forming a first conductive layer on the first insulating layer, forming trench isolation regions in the substrate extending through the first conductive layer and the first insulating layer to define an active region in the memory cell region between the trench isolation regions, and selectively removing the first conductive layer and the first insulating layer from the memory cell region of the substrate to expose a surface of the active region between the trench isolation regions.

16 Claims, 11 Drawing Sheets

FIG. 8
Related Art

METHODS OF FABRICATING FLASH MEMORY DEVICES INCLUDING SUBSTANTIALLY UNIFORM TUNNEL OXIDE LAYERS

CROSS-REFERENCE TO RELATED APPLICATIONS

This application is a divisional of and claims priority from U.S. patent application Ser. No. 11/555,796, filed on Nov. 2, 2006, now abandoned which claims priority under 35 USC §119 from Korean Patent Application No. 10-2005-0105098 filed in Korea on Nov. 3, 2005, the disclosures of which are hereby incorporated by reference in their entireties.

FIELD OF THE INVENTION

The present invention relates to memory devices, and more particularly, to flash memory devices.

BACKGROUND OF THE INVENTION

In general, a flash memory cell of a flash memory device may have a structure that includes a control gate, a coupling oxide, a floating gate and a tunnel oxide on a semiconductor substrate. The flash memory cell may be designed so that a positive voltage applied to the control gate may be coupled to the floating gate through the coupling oxide layer, and electrons in the semiconductor substrate may pass through the tunnel oxide layer by a Fowler-Nordheim (hereinafter, referred to as "F-N") tunneling and may be captured in the floating gate. The flash memory cell may be erased by applying a positive voltage to the semiconductor substrate that causes the electrons in the floating gate to return to the semiconductor substrate by F-N tunneling.

A string of serially connected flash memory cells can be connected to a bit line for serially reading data from the flash memory cells or writing data to the flash memory cells. Since this control gate may be connected to several flash memory cells along a row orthogonal to the bit line for one or more words, it may be referred to as a word line. During a write operation of the flash memory cell, a program voltage on the control gate may enable transmission of data from the bit line or an adjacent flash memory cell into the flash memory cell. The coupling oxide layer, which is formed on the floating gate, may couple the program voltage applied to the control gate during a write operation to the floating gate so as to elevate the electric potential of the floating gate to create a write voltage between the floating gate and the semiconductor substrate across the tunnel oxide.

The coupling ratio K is a factor that may determine the amount of write voltage applied across the tunneling oxide during a write operation. The write voltage (i.e., $V_{tunnel\ write}$) applied to the tunneling oxide layer during a write operation may be expressed as shown in Equation 1 below.

$$V_{tunnel\ write} = V_{floating\ gate} + K_{write} \times V_{bitline/adjacent\ cell} \quad (1)$$

Herein, $V_{floating\ gate}$ refers to a voltage applied to the floating gate due to a program voltage application, $K_{write}$ is a coupling ratio during a write operation, $V_{bitline/adjacent\ cell}$ is a bit line or adjacent flash memory cell programming voltage. The coupling ratio $K_{write}$ for a write operation can be expressed as shown in Equation 2 below.

$$K_{write} = 1 - C_{tunnel}/(C_{coupling} + C_{parasitic} + C_{tunnel}) \quad (2)$$

Herein, $C_{coupling}$ is the capacitance of the coupling oxide, $C_{tunnel}$ is the capacitance of the tunnel oxide, and $C_{parasitic}$ is the parasitic capacitance of oxide variations or anomalies at or adjacent to the edges of the of the tunnel oxide.

As the parasitic capacitance $C_{parasitic}$ increases, the coupling ratio $K_{write}$ for a write operation may decrease. A decrease in the coupling ratio $K_{write}$ for a write operation, may reduce the write efficiency for transferring data from the bit line or an adjacent flash memory cell. Such a reduction in write efficiency may be compounded each time data is serially transferred along a string of serially connected flash memory cells that each have the same reduced write efficiency. Further, there can be variations of parasitic capacitance $C_{parasitic}$ among the string of serially connected flash memory cells. To increase write efficiency, it may be desirable to reduce the parasitic capacitance $C_{parasitic}$ of a flash memory cell. In a string of serially connected flash memory cells, the parasitic capacitance $C_{parasitic}$ may be reduced in each of the flash memory cells in a string of serially connected flash memory cells to increase write efficiency. Further, it may be desirable for the parasitic capacitance $C_{parasitic}$ in the flash memory cells of a string of serially connected flash memory cells to be relatively consistent across the string of serially connected flash memory cells. Hereinafter, a method of manufacturing a conventional electrically erasable programmable read only memory (EEPROM) will be described with reference to FIGS. 6a to 6d.

Figure 6A:
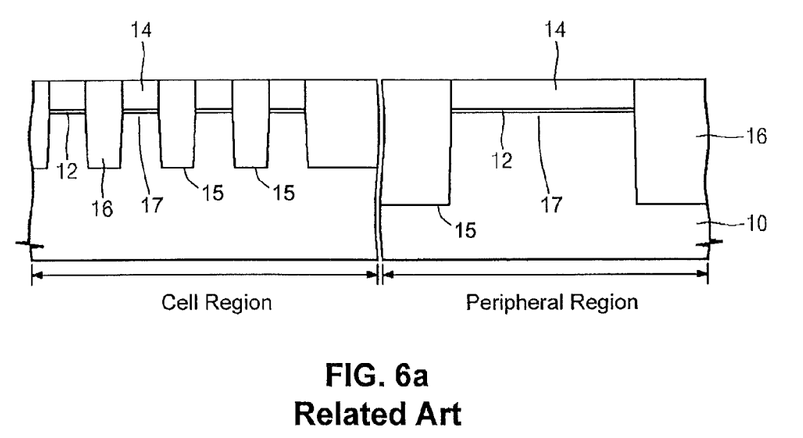
FIGS. 6a to 6d are cross-sectional views illustrating a conventional method of fabricating flash memory devices.

FIGS. 6a to 6d are cross-sectional views illustrating a conventional method of fabricating a flash memory device. As shown in FIG. 6a, a semiconductor substrate 10 includes a cell region and a peripheral region. The semiconductor substrate 10 can be single crystal silicon. The cell region is for flash memory devices and selection circuitry devices for the flash memory devices. The peripheral region is for high voltage power devices, such as power buffers, and low voltage devices that support both the selection circuits and the flash memory cells of the cell region.

The conventional method of fabricating a flash memory device illustrated in FIGS. 6a to 6d starts by forming a buffer oxide layer 12 in both the cell region and the peripheral region of the semiconductor substrate 10. Then, a hardmask layer 14 is formed on the buffer oxide layer 12 in both the cell region and the peripheral region of the semiconductor substrate 10. A mask (not shown) is then used to etch trenches 15 in both the cell region and the peripheral region through the hardmask layer 14 and the buffer oxide layer 12. Then, each of the trenches 15 and the openings in the hardmask layer 14 and in the buffer oxide layer 12 corresponding to each of the trenches 15 are filled with a dielectric, such as silicon dioxide, to form dielectric isolators 16. For increased electrical isolation between the high voltage devices of the peripheral region, the trenches 15 in the peripheral area can be wider and/or deeper than the trenches in the cell region.

Figure 6B:
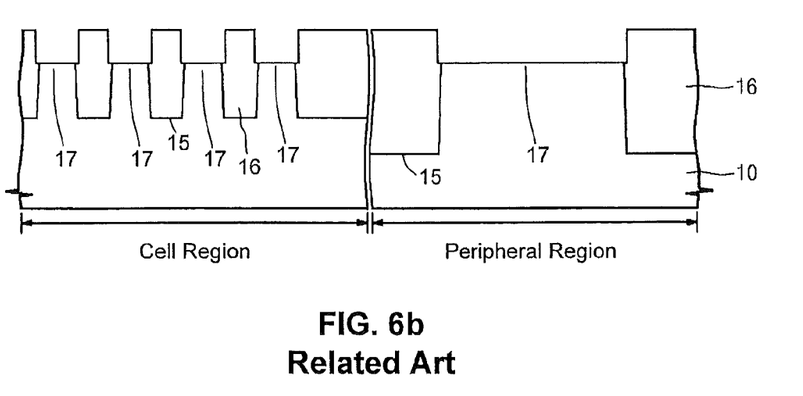

As shown in FIG. 6b, active regions 17 are revealed in both the cell region and the peripheral region of the semiconductor substrate 10 by removing the hardmask layer 14 and the buffer oxide layer 12. The dielectric isolators 16 are in the trenches 15 and extend above the active regions 17 in the semiconductor substrate 10. The dielectric isolators 16 in the cell region have the same height as the dielectric isolators 16 in the peripheral region.

Figure 6C:
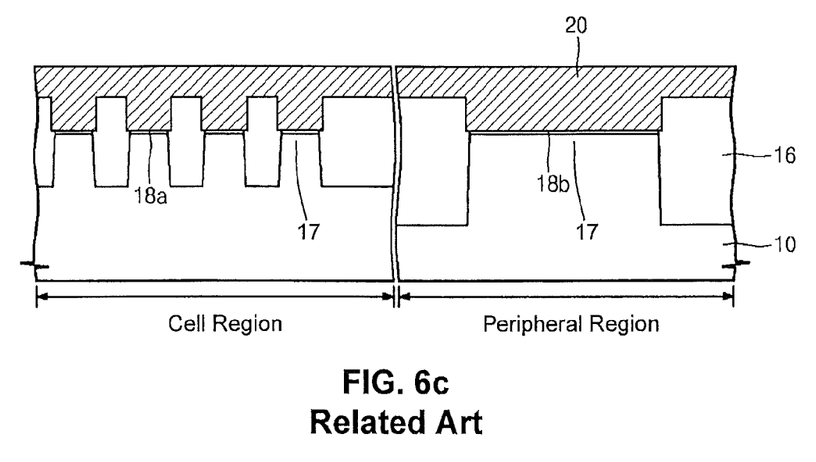

As shown in FIG. 6c, tunnel oxide layers 18a are then thermally grown on each of the active regions 17 in the cell region while gate oxide layers 18b are thermally grown on each of the active regions in the peripheral region. Subsequently, a conductive layer 20 is deposited over all of the cell region and the peripheral region, and onto the tunnel oxide layers 18a and the gate oxide layers 18b. Further, the conductive layer 20 fills the space between the dielectric isolators 16.

Figure 6D:
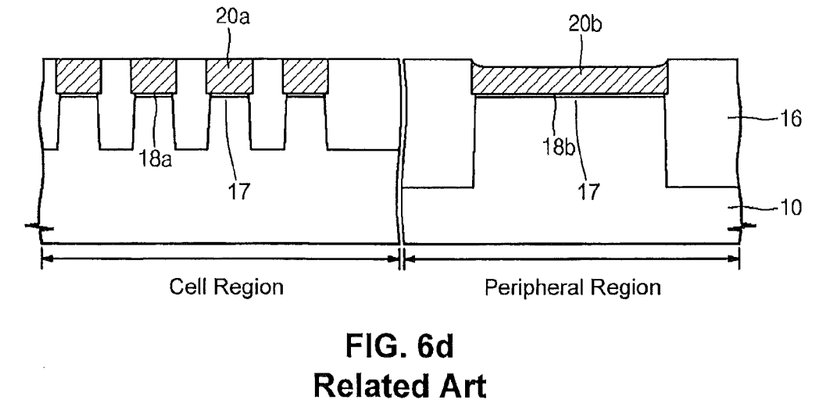

As shown in FIG. 6d, floating gates 20a are formed over the tunnel oxide layers 18a in the cell region while gate layers 20b are formed in the peripheral region by a chemical-mechanical polishing (CMP) process. More specifically, the conductive layer 20 shown in FIG. 6c is planarized to the top of the dielectric isolators 16 such that the conductive layer 20 is separated into floating gates 20a in the cell region and gate layers 20b in the peripheral region. Because of the increased width of the space between the dielectric isolators 16 in the peripheral region, there may be some dishing in the gate layers 20b from the CMP process.

Figure 7:
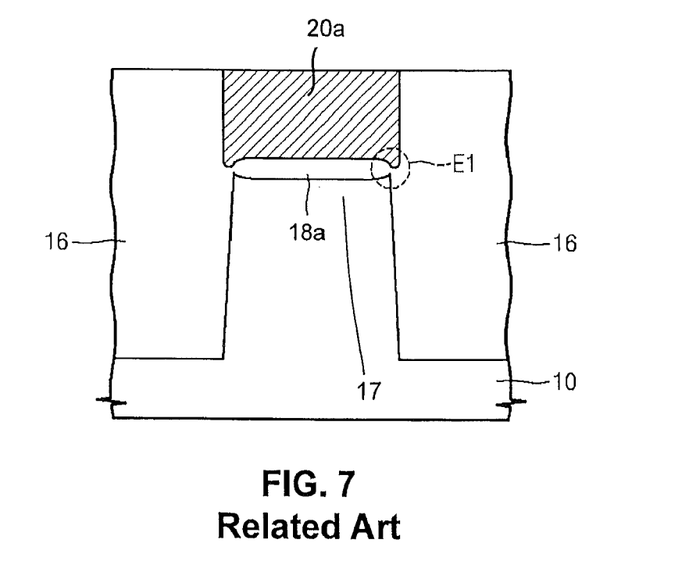
FIG. 7 is a cross-sectional view illustrating a floating gate and a tunnel oxide formed by the conventional method illustrated in FIGS. 6a to 6h.

FIG. 7 is a close-up cross-sectional view of a floating gate and a tunnel oxide grown by the related art method of fabricating illustrated in FIGS. 6a to 6d. As shown in FIG. 7, the tunnel oxide 18a is thinner near the edge of active region 17, as shown in region E1 of FIG. 7. This thinning effect may be caused by the thermal growth of the tunnel oxide 18a being suppressed at the edges of the tunnel oxide 18a because the edges of the tunnel oxide 18a are adjacent to the dielectric isolators 16. The amount of the thinning effect may not be the same for each flash memory cell of a string of flash memory cells. In other words, the thinning effect may not be consistent along a string of serially connected flash memory cells. Thus, the thinning effect may cause variations in parasitic capacitance $C_{parasitic}$ in the flash memory cells along a string of serially connected flash memory cells. Further, the thinning effect may cause electric field focusing at the bottom edges of the floating gates 20a. Such electric field focusing causes further variations in the parasitic capacitance $C_{parasitic}$ in the flash memory cells along a string of serially connected flash memory cells.

Figure 8:
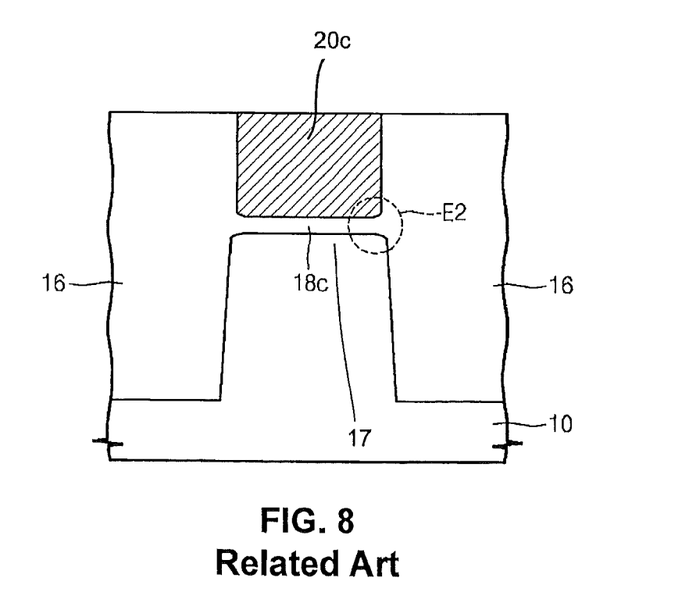
FIG. 8 is a cross-sectional view illustrating a floating gate and a tunnel oxide formed by another conventional method of fabricating a flash memory device.

FIG. 8 is a close-up cross-sectional view of a floating gate and a tunnel oxide of another conventional method of fabricating a flash memory device. The other conventional method of fabricating a flash memory device starts by thermally growing a tunnel oxide layer over the entire surface of the semiconductor substrate 10 in both the cell region and the peripheral region of the semiconductor substrate. Then, a conductive layer is formed on the tunnel oxide layer in both the cell region and the peripheral region of the semiconductor substrate 10. A mask is then used to etch trenches 15 in both the cell region and the peripheral region through the conductive layer and the tunnel oxide layer to form a gate layer 20c on a tunnel oxide layer 18c above an active region 17. Such a fabrication method is known as a self-aligned trench isolation method.

The thinning effect at the edges of the tunnel oxide layer 18c does not occur in a self-aligned trench isolation method. However, the edges of the tunnel oxide layer 18c tend to be thicker than a center portion of the tunnel oxide layer 18c, as shown in region E2 of FIG. 8. This thickening at the edges of the tunnel oxide layer 18c may occur during a repair processing to repair dry etch damage caused by the etching of the trenches 15 and to round the edges of the active regions 17 to prevent stress defects in the active regions 17 of both the cell region and the peripheral region. The repair processing may grow thin oxide layers on the semiconductor substrate 10 in the trenches 15 and on the sides of the gate layer 20c.

The gate layer 20c is made of polycrystalline silicon. The oxidation rate of polycrystalline silicon is greater than single crystal silicon. Because the gate layer 20c is made of polycrystalline silicon, the repair processing thickens the edges of the tunnel oxide layer 18c due to oxidation of the edges of the gate layer 20c adding to the thickness of the tunnel oxide layer 18c at the edges of the tunnel oxide layer 18c.

The thickened edges of the tunnel oxide layer 18c may increase the parasitic capacitance $C_{parasitic}$ of the flash memory cell. Further, the thickened edges of the tunnel oxide layer 18c may prevent shrinkage of the design rules for obtaining a functional tunneling oxide layer.

SUMMARY OF THE INVENTION

According to some embodiments of the present invention, a method of forming flash memory devices in a cell region of a semiconductor substrate may include forming a first gate oxide layer on the semiconductor substrate, forming a first gate layer on the first gate oxide layer; forming trench isolation regions in the semiconductor substrate through the first gate oxide layer and the first gate layer to define active regions, and removing the first gate oxide layer and the first gate layer from the first active regions in the cell region.

In other embodiments, a method of forming a flash memory circuit in a semiconductor substrate with a memory cell region and a peripheral circuit region may include forming a first gate oxide layer on the semiconductor substrate, forming a first gate layer on the first gate oxide layer, forming trench isolation regions in the semiconductor substrate through the first gate oxide layer and the first gate layer to define first active regions of the cell region and second active regions of the peripheral circuit region, and removing the first gate oxide layer and the first gate layer from the first active regions in the cell region.

In still other embodiments, a method of forming a flash memory circuit in a semiconductor substrate with a memory cell region and a peripheral circuit region may include forming a first gate oxide layer on the semiconductor substrate in both the cell region and the peripheral region, forming a first gate layer on the first gate oxide layer in both the cell region and the peripheral region, forming trench isolation regions in the peripheral region and cell region of the semiconductor substrate, forming a masking layer over the first gate layer, the first gate oxide layer and trench isolation region in the peripheral region, and removing the first gate oxide layer and the first gate layer from the cell region.

According to further embodiments of the present invention, a method of fabricating a flash memory device in a memory cell region of a substrate may include forming a first insulating layer on the substrate, and forming a first conductive layer on the first insulating layer. Trench isolation regions may be formed in the substrate extending through the first conductive layer and the first insulating layer to define an active region in the memory cell region between the trench isolation regions. The first conductive layer and the first insulating layer may be selectively removed from the memory cell region of the substrate to expose a surface of the active region between the trench isolation regions. In addition, at least a portion of the active region between the trench isolation regions may be removed to reduce rounding at edges of the surface of the active region adjacent sidewalls of the trench isolation regions. Also, portions of the sidewalls of the trench isolation regions adjacent the edges of the surface of the active region may be removed to form curved sidewall portions of the of the trench isolation regions adjacent the edges of the surface of the active region.

In some embodiments, a second insulating layer may be formed on the surface of the active region, and a floating gate electrode may be formed on the second insulating layer. In addition, a third insulating layer may be formed on the floating gate electrode, and a control gate electrode may be formed on the third insulating layer.

In other embodiments, a second insulating layer having a substantially uniform thickness may be formed on the surface of the active region. In addition, a floating gate electrode having curved edge portions may be formed on the curved sidewall portions of the of the trench isolation regions.

In some embodiments, the substrate may include a peripheral circuit region adjacent the memory cell region. A masking layer may be formed over the first conductive layer and the first insulating layer in the peripheral circuit region. As such, the first insulating layer and the first conductive layer may be selectively etched in the memory cell region while maintaining the first conductive layer and the first insulating layer in the peripheral circuit region.

According to still further embodiments of the present invention, a method of fabricating a flash memory device on a substrate including a memory cell region and a peripheral circuit region may include forming a first insulating layer on the substrate, and forming a first conductive layer on the first insulating layer. Trench isolation regions may be formed in the substrate extending through the first conductive layer and the first insulating layer to define a first active region in the memory cell region and a second active region in the peripheral circuit region. A masking layer may be formed over the first conductive layer and the first insulating layer in the peripheral circuit region, and the first conductive layer and the first insulating layer may be selectively etched in the memory cell region to expose a surface of the first active region while maintaining the first conductive layer and the first insulating layer in the peripheral circuit region. A second insulating layer may be formed on the exposed surface of the first active region, and a floating gate electrode may be formed on the second insulating layer in the memory cell region.

DETAILED DESCRIPTION OF EMBODIMENTS OF THE INVENTION

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1A:
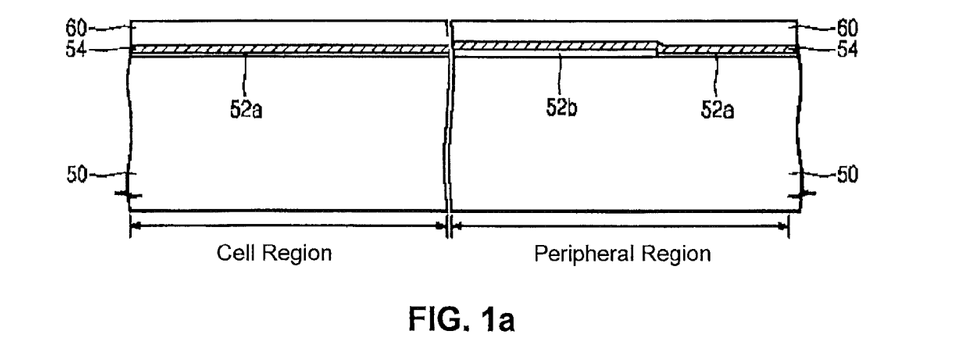
FIGS. 1a to 1h are cross-sectional views illustrating methods of fabricating flash memory devices in accordance with some embodiments of the present invention.

FIGS. 1a to 1h are cross-sectional views illustrating a method of fabricating a flash memory device in accordance with some embodiments of the present invention. As shown in FIG. 1a, a semiconductor substrate 50 includes a cell region and a peripheral region. The semiconductor substrate can be single crystal silicon. The cell region is for flash memory devices and selection circuitry devices for the flash memory devices. The peripheral region is for high voltage power devices, such as power buffers, and low voltage devices that support both the selection circuits and flash memory cells of the cell region.

A first gate oxide layer 52a is formed in both the cell region and the peripheral region of the semiconductor substrate 50, as shown in FIG. 1a. The semiconductor substrate 50 can be thermally oxidized to the form the first gate oxide layer 52a. Because there are power devices in the peripheral region that may require a thicker gate oxide than other low-voltage devices in the peripheral region, the thickness of the first gate oxide layer 52a in the power device section of the peripheral region can be increased to be a thick first gate oxide layer 52b, which is thicker than the first gate oxide layer 52a. The first gate oxide layer 52a can be thickened by forming a mask over all of the first gate oxide layer 52a except for the portion to be thickened, and then thickening the exposed portion of the first gate oxide layer 52a with an $O_2$ gas treatment, for example.

A first gate layer 54, such as polycrystalline silicon layer, is then formed on the first gate oxide layer 52a in the cell region and on both the first gate oxide layer 52a and the thicker first gate oxide layer 52b in the peripheral region, as shown in FIG. 1a. Subsequently, a first hardmask layer 60 is formed on the first gate layer 54 in both the cell region and the peripheral region of the semiconductor substrate 50. The first hardmask layer 60 can be formed of silicon nitride (SiN), or a laminate of silicon nitride and silicon oxide (SiN/SiO).

The first gate oxide 52a may serve as a stress release layer for the first hardmask layer 60 in the cell region. The first gate oxide layer 52a may serve as a stress release layer for the first hardmask layer 60 in the peripheral region and as gate oxide layers of subsequently formed low-voltage devices in the peripheral region. The thicker first gate oxide layer 52b can also serve as a stress release layer for the first hardmask layer 60 in the peripheral region and as gate oxide layers of subsequently formed power devices in the peripheral region. The first gate layer 54 can serve as first gate electrodes of subsequently formed low-voltage devices and power devices in the peripheral region.

Figure 1B:
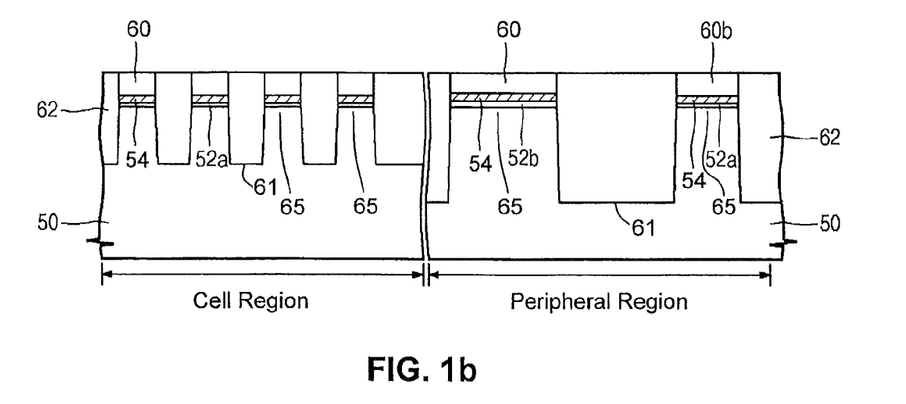

Referring to FIG. 1b, a mask (not shown) is then used to etch trenches 61 in both the cell region and the peripheral region through the first hardmask layer 60, the first gate layer 54 and the first gate oxide layers 52a/52b. The trenches 61 define active regions 65 in both the cell region and the peripheral region of the semiconductor substrate 50. As shown in FIG. 1b, each of the trenches 61, and the openings in the first hardmask layer 60, the first gate layer 54, the first gate oxide layers 52a and the thicker first gate oxide layer 52b corresponding to each of the trenches 61 are filled with a dielectric, such as silicon dioxide, to form dielectric isolators 62. For increased electrical isolation between the high voltage devices of the peripheral region, the trenches 61 in the peripheral area can be wider and/or deeper than the trenches in the cell region. Further, the power devices in the peripheral region having the thicker first gate oxide 52b are separated from the low-voltage devices in the peripheral region having the first gate oxide 52a by the trenches 61.

Figure 2A:
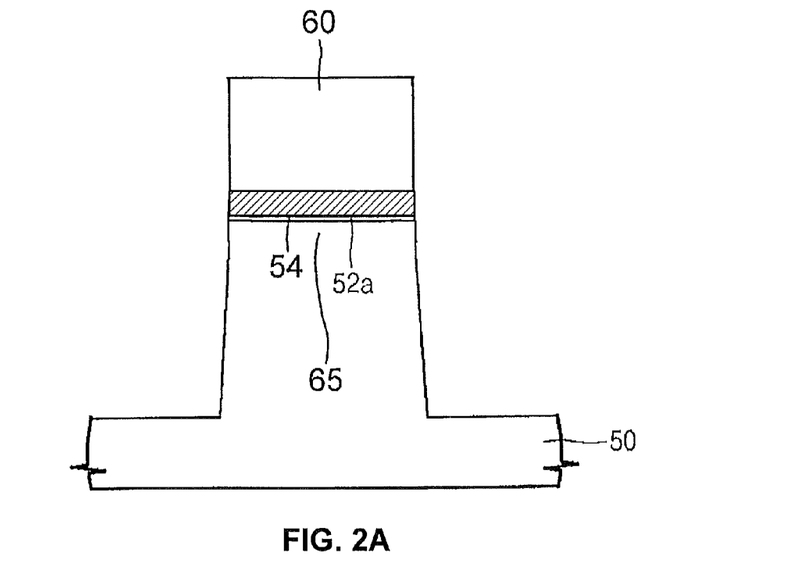
FIGS. 2A-2D are cross-sectional views illustrating methods of fabricating an active region in the cell region of FIG. 1b.
Figure 2B:
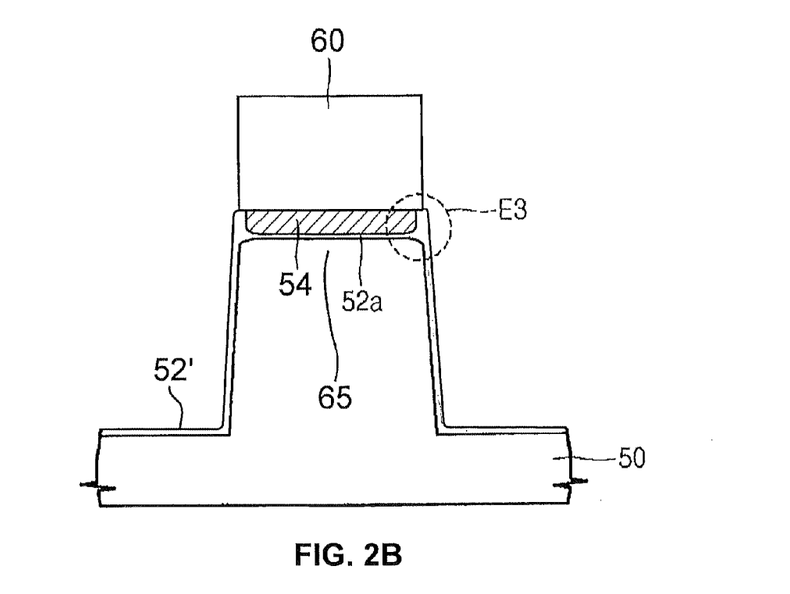
Figure 2C:
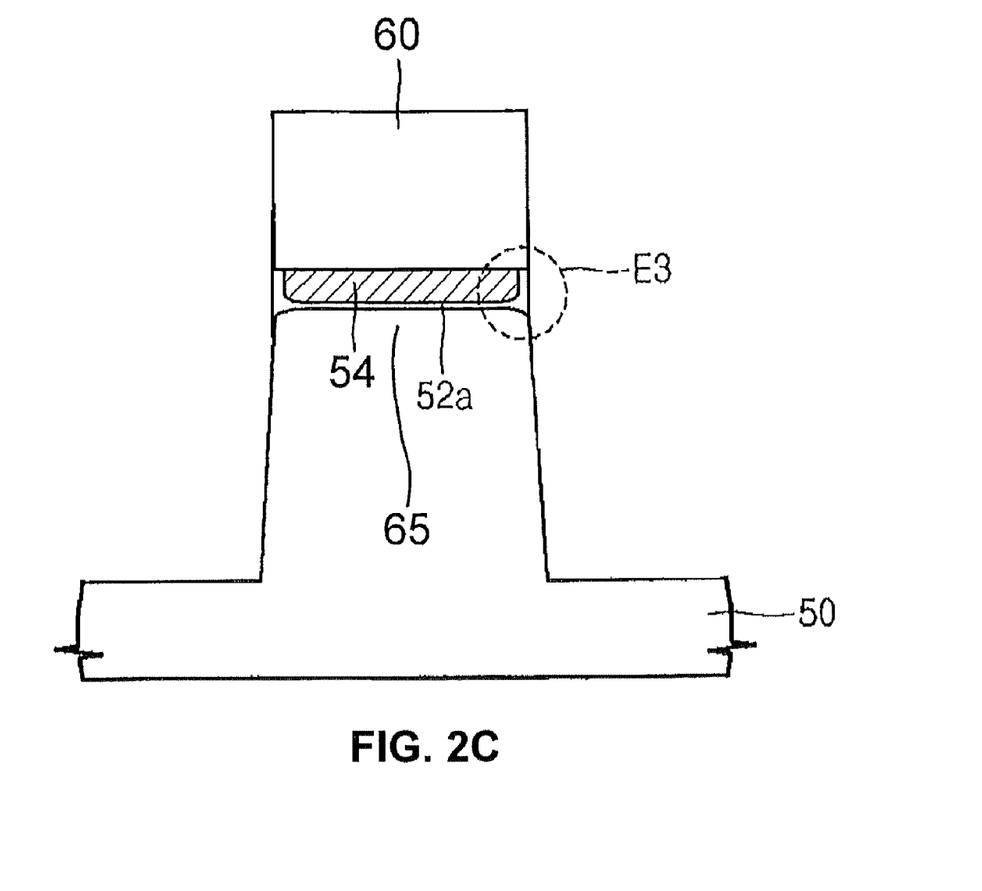
Figure 2D:
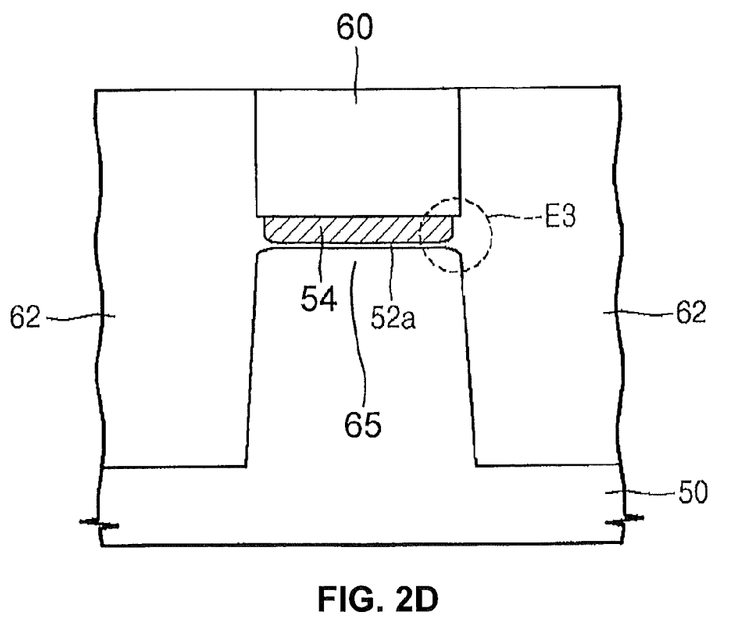

FIGS. 2A-2D are close-up cross-sectional views illustrating the formation of an active region in the cell region of FIG. 1b. Prior to dielectric being provided into the trenches 61, thermal processing is performed to repair dry etch damage caused by the etching of the trenches 61 and to round the edges of the active regions 65 to prevent stress defects in the active region 65. In particular, as shown in FIGS. 2A-2B, the thermal processing grows a thin oxide layer 52' on the semiconductor substrate 10 in the trenches 61 and at sidewalls of the first gate layer 54. Because the first gate layer 54 is made of polycrystalline silicon and the oxidation rate of polycrystalline silicon is greater single crystal silicon, the thermal processing thickens the edges of the first gate oxide layer 52a due to oxidation of the edges of the first gate layer 54 adding to the thickness of the first gate oxide layer 52a at the edges of the first gate oxide layer 52a, as shown in region E3 of FIGS. 2B-2D. The thin oxide layer 52' can be removed from the edges of the first gate oxide layer 52a and the trenches 61 in the semiconductor substrate, as shown in FIG. 2C.

Figure 1C:
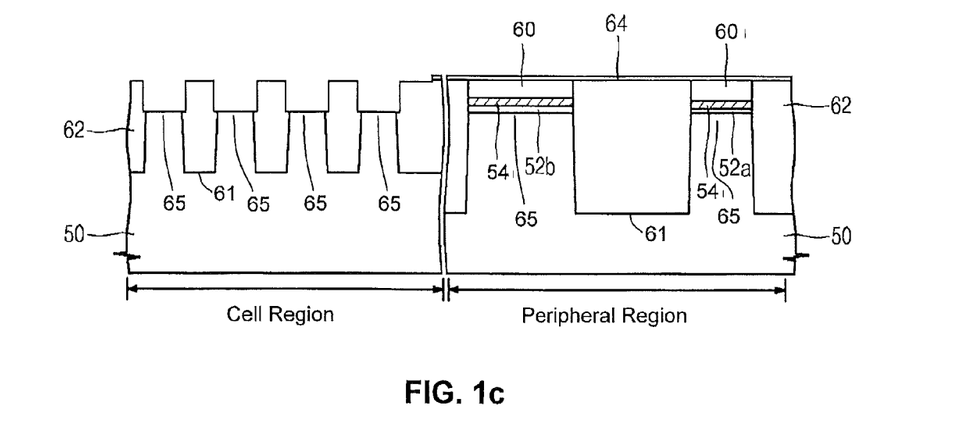

After the dielectric isolators 62 are formed in trenches 61, a mask insulation 64 is formed over the first hardmask layer 60, the first gate layer 54, the first gate oxide layers 52a, the thicker first gate oxide layer 52b and the dielectric isolators 62 in the peripheral region of the semiconductor substrate 50, as shown in FIG. 1c. Then, the active regions 65 in the cell region are exposed by a selective wet etching of the first hardmask layer 60, the first gate layer 54 and the first gate oxide layers 52a in the cell region. As such, portions of the active regions 65 in the cell region of the semiconductor substrate 50 are also slightly reduced/removed by the selective wet etch so as to widen and flatten the surfaces of the active regions 65.

Figure 3:
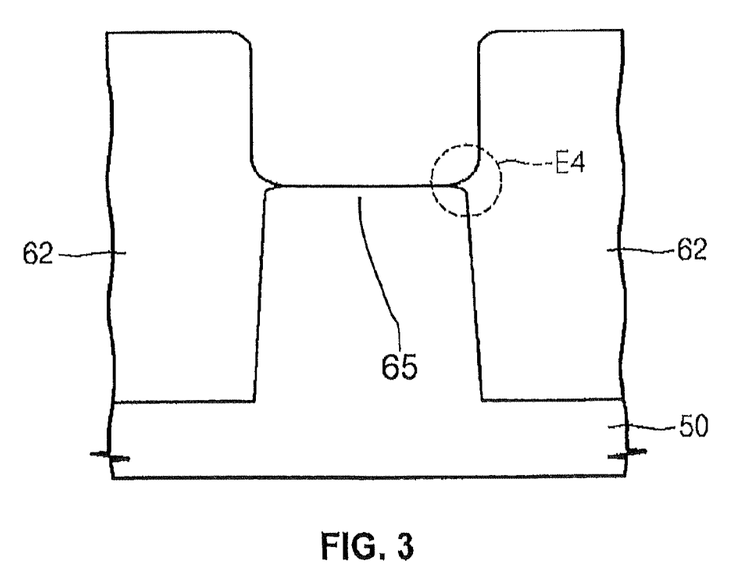
FIG. 3 is a cross-sectional view illustrating an active region in the cell region of FIG. 1c.

FIG. 3 is a close-up cross-sectional view of an active region in the cell region of FIG. 1c. Because the active regions 65 are tapered portions of the semiconductor substrate 50, slightly reducing and/or removing surface portions of the active regions 65 may widen the surfaces of the active regions. Further, the reduction of the of the active regions 65 lessens some of the rounding at the edges of the active regions 65 to flatten the active regions 65, as shown in region E4 of FIG. 3. The selective wet etch also slightly reduces the sidewalls of the dielectric isolators 62 so as to provide a gentle slope or curved portion in the dielectric isolators 62 at the edges of the active regions 65, as shown in region E4 of FIG. 3.

Figure 1D:
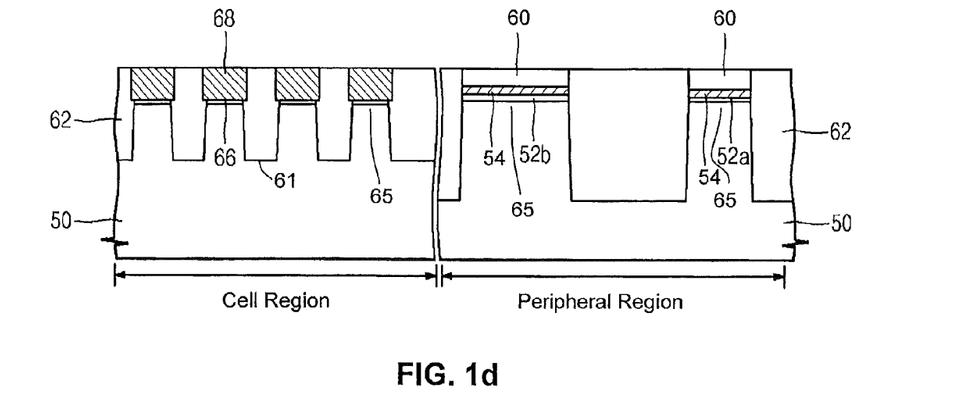

After the active regions 65 in the cell region are exposed, tunnel oxide layers 66 are then formed on the active regions 65 in the cell region of the substrate 50, as shown in FIG. 1d. The tunnel oxide layers 66 can be formed by thermal oxidation of the active regions 65 in the cell region of the substrate 50. Then, second gate layers 68 are formed on the tunnel oxide layers 66 between the dielectric isolators 62 by depositing a conductive layer over the active regions 65 and the dielectric isolators 62 in the cell region, and planarizing the conductive layer to the top surface of the dielectric isolators 62 with a CMP process. The mask insulation 64 over the peripheral region can also be removed by the CMP process for forming the second gate layers 68.

Figure 4:
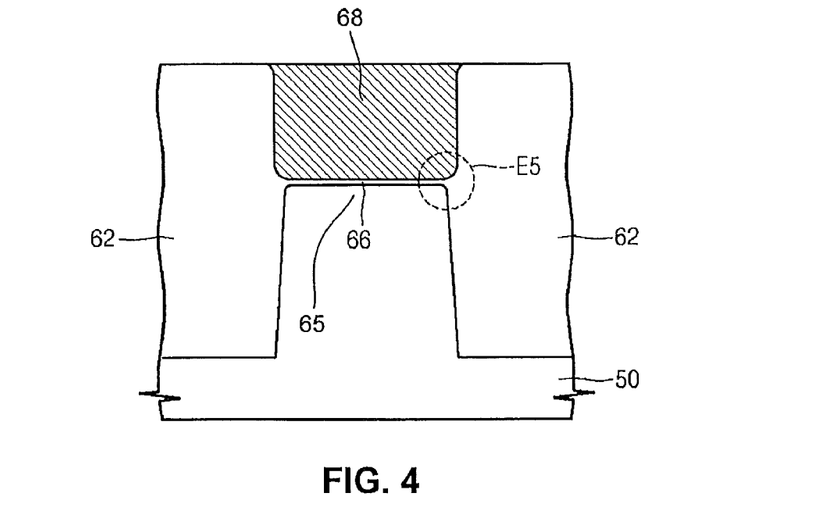
FIG. 4 is a cross-sectional view illustrating an active region in the cell region of FIG. 1d.

FIG. 4 is a close-up cross-sectional view of an active region in the cell region of FIG. 1d. The tunnel oxide layer 66 has a substantially consistent and/or relatively uniform thickness across the surface of the active region 65, as shown in region E5 of FIG. 4. There is relatively little thinning effect at the edges of the tunnel oxide layer 66. Due to the gentle slope in the dielectric isolators 62 to the edges of the active regions 65, the tunnel oxide layer 66 has a consistent thickness at the edges of the active region 65.

Figure 1E:
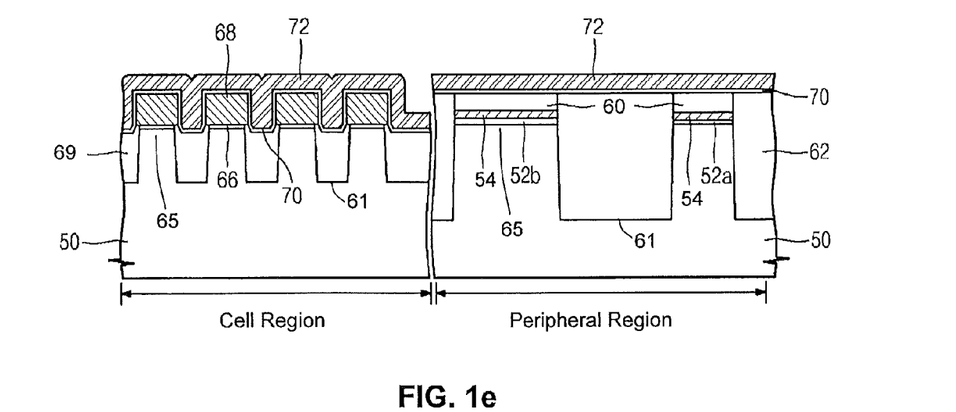

As shown in FIG. 1e, the middle portions of the dielectric isolators 62 in the cell region are recessed below the top surface of the active regions 65 using a mask (not shown) and a two-step etching process, including an isotropic etch followed by an anisotropic etch. Accordingly, shallow trench isolators 69 are formed between devices in the cell region of the semiconductor substrate 50 and dielectric isolators 62 between the devices of the peripheral region of the semiconductor substrate 50.

A coupling oxide layer 70 is then formed over the second gate layers 68 and the shallow trench isolators 69 in the cell region, and over the first gate layers 54 and the dielectric isolators 62 in the peripheral region. The coupling oxide layer 70 can be formed of oxide, nitride, oxynitride or laminates thereof, such as a silicon oxide/silicon nitride/silicon oxide laminate (SiO/SiN/SiO). A third gate layer 72 is then provided on the coupling oxide layer 70 in both the cell region and the peripheral region of the semiconductor substrate 50. The third gate layer 72 can be made of doped polycrystalline silicon.

Figure 1F:
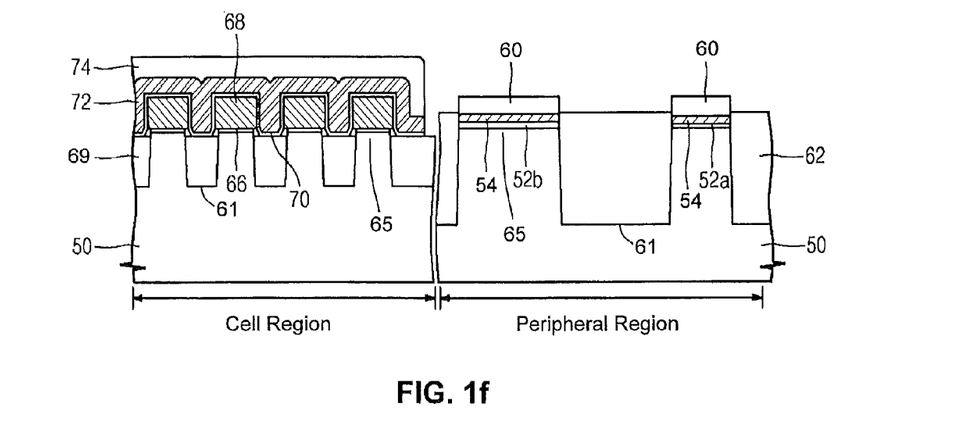

After the third gate layer 72 is deposited, a second hardmask layer 74 is formed completely over the cell region of the semiconductor substrate 50, as shown in FIG. 1f. Then, the second gate layer 72 and the coupling oxide layer 70 in the peripheral region of the semiconductor substrate 50 are removed. The dielectric isolators 62 are reduced below the first hardmask layers 60 above the active regions in the peripheral region of the semiconductor substrate 50. Then, the first hardmask layers 60 in the peripheral region of the semiconductor substrate 50 are removed and the second hardmask layer 74 in the cell region of the semiconductor substrate 50 is removed.

Figure 1G:
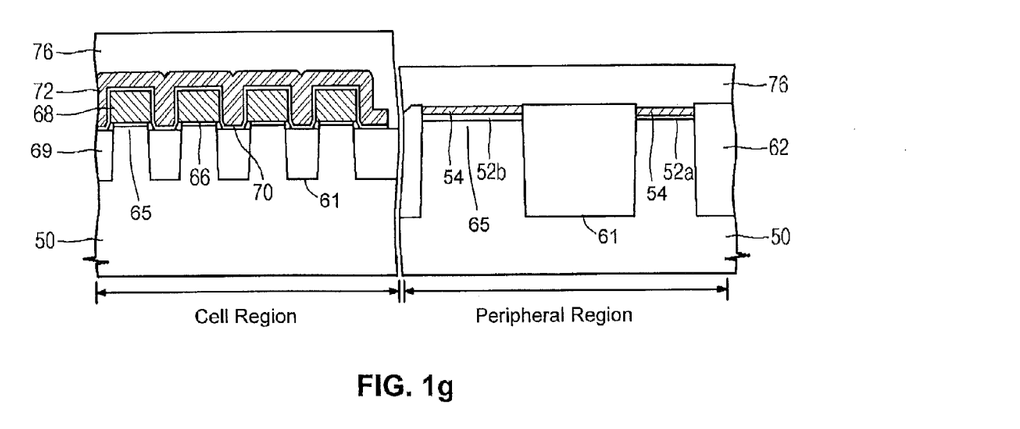

Referring to FIG. 1g, a fourth gate layer 76 is provided on the third gate layer 72 in the cell region of the semiconductor substrate 50 and on the first gate layers 54 in the peripheral region of the semiconductor substrate 50. The fourth gate layer 76 can be undoped polycrystalline silicon or metal. In another alternative, the fourth gate layer 76 can be silicide.

Figure 1H:
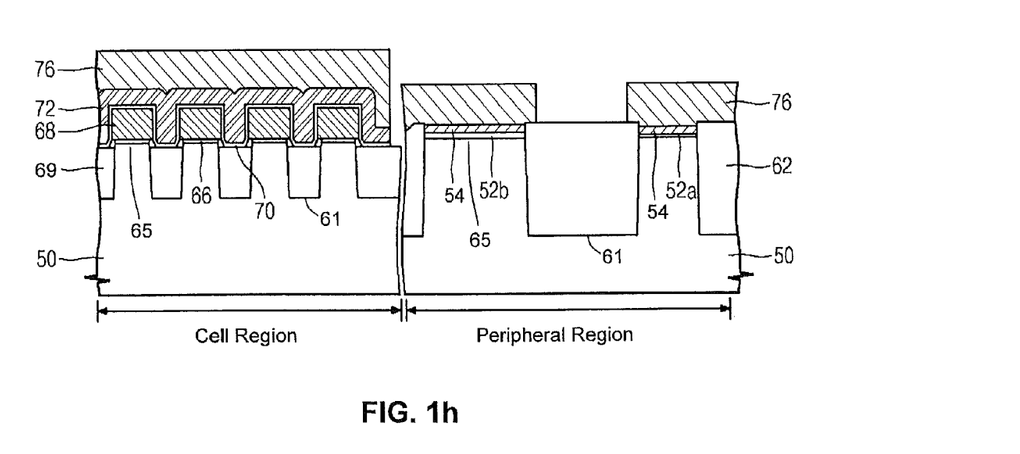

As shown in FIG. 1h, the fourth gate layer 76, the third gate layer 72, the coupling oxide layer 70, the floating gate pattern 68 can be patterned to form a flash memory cell structure in the cell region. The fourth gate layer 76 can be patterned in the peripheral region for connections to the first gate layers 54. At least some of the second gate layers 68 in the cell region of the semiconductor substrate 50 are floating gates for the flash memory cells. The fourth gate layer 76 together with the third gate layer 72 forms the control gate/word line in the of the semiconductor substrate 50.

Figure 5:
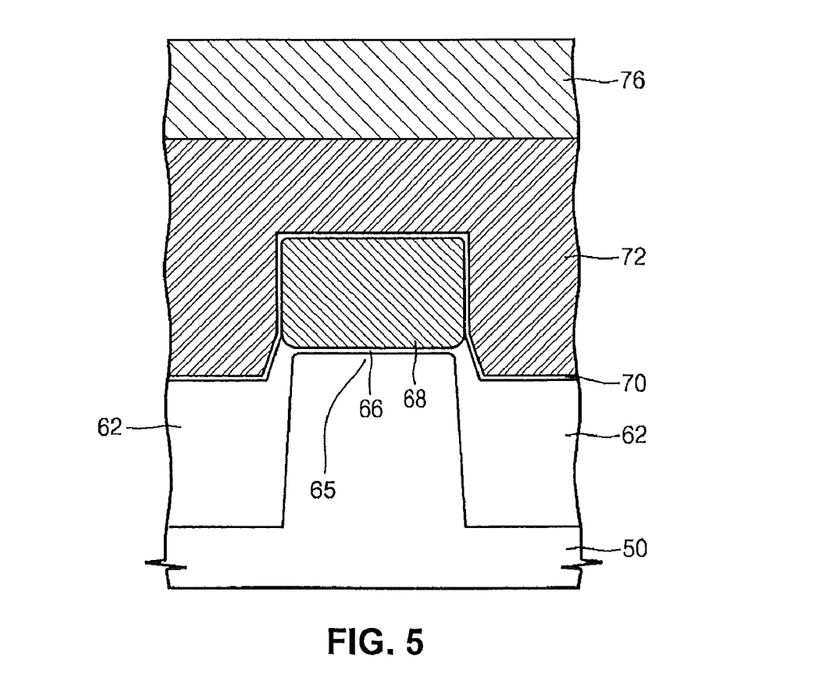
FIG. 5 is a cross-sectional view illustrating an active region in the cell region of FIG. 1h.

FIG. 5 is a close-up cross-sectional view of an active region in the cell region of FIG. 1h. As shown in FIG. 5, the bottom edges of the second gate layers 68 (floating gate) have a gentle curve or round. Thus, electric field focusing does not occur at the bottom edges of the of the second gate layers 68 (floating gates).

Embodiments of the present invention form a flash memory device having reduced parasitic capacitance by forming a tunnel oxide with a relatively consistent and/or substantially uniform thickness. Variations in parasitic capacitance are reduced by providing a gentle slope in the dielectric isolators at the edges of the active regions in the flash memory cells. Further, other variations in parasitic capacitance are reduced by providing a gentle curve in the bottom edges of the floating gates.

While the present invention has been shown and described with reference to exemplary embodiments thereof, it will be understood by those of ordinary skill in the art that various changes in form and detail may be made herein without departing from the spirit and scope of the present invention, as defined by the following claims.

That which is claimed:

1. A method of forming a flash memory device in a substrate including a memory cell region and a peripheral circuit region, the method comprising:
   forming a first gate oxide layer on the substrate;
   forming a first gate layer comprising polycrystalline silicon on the first gate oxide layer:
   forming trench isolation regions in the substrate extending through the first gate oxide layer and the first gate layer to define first active regions of the memory cell region and second active regions of the peripheral circuit region; and
   selectively removing the first gate oxide layer and the first gate layer from the first active regions in the memory cell region while maintaining the first gate layer and the first gate oxide layer in the second active regions in the peripheral circuit region.

2. The method according to claim 1, wherein forming the trench isolation regions includes:
   etching the first gate oxide layer, the first gate layer and the substrate to form an opening;
   thermally processing the substrate to repair damage caused by the etching; and
   depositing an insulator in the opening.

3. The method according to claim 2, wherein the thermal processing to repair damage caused by the etching includes:
   growing an oxide film on a sidewall of the first gate layer and on the substrate in the opening.

4. The method according to claim 3, further comprising:
   etching a portion of the grown oxide film on the first gate layer and on the substrate in the opening.

5. The method according to claim 1, further comprising the following after selectively removing the first gate oxide layer and the first gate layer from the first active regions in the memory cell region:
   forming second gate oxide layers respectively on each of the first active regions;
   forming floating gate layers respectively on each of the second gate oxide layers;
   forming a third gate oxide layer on the floating gate layers; and
   forming a control gate on the third gate oxide layer.

6. The method according to claim 5, further comprising:
   forming an upper control electrode on the control gate.

7. The method according to claim 1, further comprising:
   recessing the trench isolation regions in the memory cell region below an upper surface of semiconductor substrate in the memory cell region.

8. The method of claim 1, wherein selectively removing further comprises:
   removing portions of the sidewalls of the trench isolation regions adjacent the edges of the surface of the active region to form curved sidewall portions of the of the trench isolation regions adjacent the edges of the surface of the active region.

9. A method of forming a flash memory device in a substrate including a memory cell region and a peripheral circuit region, the method comprising:
   forming a first gate oxide layer on the substrate;

forming a first gate layer comprising polycrystalline silicon on the first gate oxide layer:

forming trench isolation regions in the substrate extending through the first gate oxide layer and the first gate layer to define first active regions of the memory cell region and second active regions of the peripheral circuit region;

forming a masking layer over the first gate layer and the first gate oxide layer in the peripheral circuit region;

selectively removing the first gate oxide layer and the first gate layer from the first active regions in the memory cell region, wherein selectively removing the first gate oxide layer and the first gate layer from the memory cell region comprises selectively etching the first gate oxide layer and the first gate layer in the memory cell region while maintaining the first gate layer and the first gate oxide layer in the peripheral circuit region;

forming second gate oxide layers respectively on each of the first active regions;

forming floating gate layers respectively on each of the second gate oxide layers;

forming a third gate oxide layer on the floating gate layers; and forming a control gate on the third gate oxide layer.

10. The method according to claim 9, further comprising:
removing the masking layer;
forming an upper control electrode on the control gate in the first active regions of the memory cell region; and
forming an upper gate layer on the first gate layer in the second active regions of the peripheral circuit region.

11. The method according to claim 9, wherein forming the trench isolation regions includes:
etching the first gate oxide layer, the first gate layer and the substrate to form an opening;
thermally processing the substrate to repair damage caused by the etching; and
depositing an insulator in the opening.

12. The method according to claim 11, wherein the thermal processing to repair damage caused by the etching includes:
growing an oxide film on a sidewall of the first gate layer and on the substrate in the opening.

13. The method according to claim 12, further comprising:
etching a portion of the grown oxide film on the first gate layer and on the substrate in the opening.

14. The method according to claim 9, further comprising:
forming an upper control electrode on the control gate.

15. The method according to claim 9, further comprising:
recessing the trench isolation regions in the memory cell region below an upper surface of semiconductor substrate in the memory cell region.

16. The method according to claim 9, wherein selectively removing further comprises:
removing portions of the sidewalls of the trench isolation regions adjacent the edges of the surface of the active region to form curved sidewall portions of the of the trench isolation regions adjacent the edges of the surface of the active region.

* * * * *